United States Patent
He et al.

(10) Patent No.: US 9,252,243 B2
(45) Date of Patent: Feb. 2, 2016

(54) GATE STRUCTURE INTEGRATION SCHEME FOR FIN FIELD EFFECT TRANSISTORS

(71) Applicant: INTERNATIONAL BUSINESS MACHINES CORPORATION, Armonk, NY (US)

(72) Inventors: Hong He, Schenectady, NY (US); Chiahsun Tseng, Wynantskill, NY (US); Chun-Chen Yeh, Clifton Park, NY (US); Yunpeng Yin, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 44 days.

(21) Appl. No.: 14/175,441

(22) Filed: Feb. 7, 2014

(65) Prior Publication Data

US 2015/0228762 A1 Aug. 13, 2015

(51) Int. Cl.
*H01L 21/8234* (2006.01)
*H01L 29/66* (2006.01)
*H01L 29/78* (2006.01)
*H01L 29/08* (2006.01)

(52) U.S. Cl.
CPC ...... *H01L 29/66795* (2013.01); *H01L 29/0847* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 6,987,289 B2 | 1/2006 | Nowak | |
| 7,041,542 B2 | 5/2006 | Ahmed et al. | |
| 8,099,686 B2 | 1/2012 | Schultz | |
| 8,436,404 B2 | 5/2013 | Bohr et al. | |
| 8,617,937 B2 * | 12/2013 | Cheng | H01L 21/845 438/142 |
| 8,828,839 B2 * | 9/2014 | Brunco | H01L 21/762 257/E21.023 |
| 2012/0132616 A1 | 5/2012 | Barnola et al. | |
| 2012/0211808 A1 | 8/2012 | Wei et al. | |
| 2012/0235234 A1 | 9/2012 | Chang et al. | |
| 2012/0313170 A1 | 12/2012 | Chang et al. | |
| 2013/0099295 A1 | 4/2013 | Baars et al. | |
| 2013/0134485 A1 | 5/2013 | Fumitake | |

* cited by examiner

*Primary Examiner* — Jack Chen
(74) *Attorney, Agent, or Firm* — Tutunjian & Bitetto, P.C.; Vazken Alexanian

(57) ABSTRACT

In one embodiment, a semiconductor device is provided that includes a gate structure present on a channel portion of a fin structure. The gate structure includes a dielectric spacer contacting a sidewall of a gate dielectric and a gate conductor. Epitaxial source and drain regions are present on opposing sidewalls of the fin structure, wherein surfaces of the epitaxial source region and the epitaxial drain region that is in contact with the sidewalls of the fin structure are aligned with an outside surface of the dielectric spacer. In some embodiments, the dielectric spacer, the gate dielectric, and the gate conductor of the semiconductor device are formed using a single photoresist mask replacement gate sequence.

15 Claims, 10 Drawing Sheets

GATE STRUCTURE INTEGRATION SCHEME FOR FIN FIELD EFFECT TRANSISTORS

BACKGROUND

1. Technical Field

The present disclosure relates to semiconductor devices, such as semiconductor devices including fin structures.

2. Description of the Related Art

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel that is electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (finFET).

SUMMARY

In one aspect, a method is disclosed for forming a semiconductor device that includes depositing a dielectric layer over a fin structure, and forming a sacrificial structure on a portion of the dielectric layer, in which the sacrificial structure includes a mandrel portion and a spacer mask portion. The dielectric layer is then etched using the sacrificial structure as an etch mask. Source and drain structures are formed on opposing sides of a portion of the fin structure that the sacrificial structure is present on. The mandrel portion of the sacrificial structure is removed, and the dielectric layer is etched selective to the spacer mask portion. A remaining portion of the dielectric layer provides a gate sidewall spacer on opposing sides of the fin structure. A gate structure is formed on a channel region portion of the fin structure in contact with the gate sidewall spacer.

In another embodiment, a method of forming a semiconductor device is provided that includes depositing a dielectric layer over a plurality of fin structures, and forming a plurality of sacrificial structures on a portion of the dielectric layer. Each sacrificial structure of the plurality of sacrificial structures includes a mandrel portion and a spacer mask portion. The plurality of fin structures is etched selectively to the plurality of sacrificial structures to expose a sidewall portion of the plurality of fin structures. Source and drain structures are formed on the sidewall portion of the plurality of fin structures. The mandrel portion of the plurality of sacrificial structures may then be removed. The dielectric layer is etched selective to the spacer mask portion. A remaining portion of the dielectric stack provides the gate sidewall spacers. A gate structure is formed on a channel region portion of each of the plurality of fin structures, in which the gate structure is in contact with the gate sidewall spacers.

In another aspect, the present disclosure provides a semiconductor device including a fin structure. In one embodiment, the semiconductor device includes a gate structure that is present on a channel region portion of a fin structure. The gate structure includes a gate sidewall spacer contacting a sidewall of a gate dielectric and a gate conductor. An epitaxial source region and an epitaxial drain region are present on opposing sidewalls of the fin structure. The surfaces of the epitaxial source region and the epitaxial drain region that are in contact with the sidewalls of the fin structure are aligned with an outside surface of the gate sidewall spacer.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE PREFERRED EMBODIMENTS

Figure 1A:
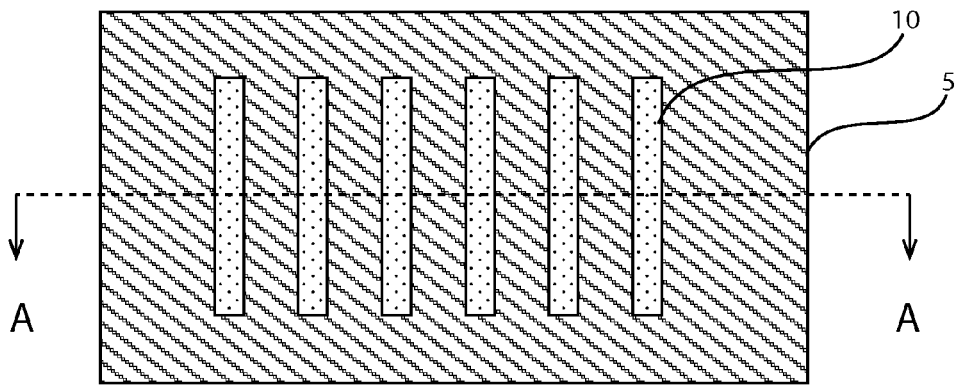
FIG. 1A is a top down view depicting forming a plurality of fin structures from a bulk semiconductor substrate, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein provide fin field effect transistors. A "field effect transistor (FET)" is a semiconductor device in which the output current, i.e., source-drain current, is controlled by the voltage applied to the gate. A FET has three terminals, i.e., gate structure, source region and drain region. A gate structure is a structure used to control output current (i.e., flow of carriers in the channel) of a semiconducting device through electrical or magnetic fields. A finFET is a field effect transistor in which at least the channel region portion of the field effect transistor is present in a fin structure. The channel region portion is the region underlying the gate structure and between the source and drain of a semiconductor device that becomes conductive when the semiconductor device is turned on.

In the prior finFET manufacturing, the integration process typically includes a sequence of (1) fin formation; (2) dummy gate formation (also referred to sacrificial gate or replacement gate); (3) gate sidewall spacer formation; (4) source and drain epitaxial merging of the fin structures; (5) replacement of the dummy gate with a functional gate structure; and (6) self-aligned contact formation. The prior finFET manufacture process results in a variation in gate pitch, i.e., gate critical dimension variation, as well as resulting in contact to gate overlay errors. Furthermore, the multiple etch steps required for forming the gate sidewall spacer, and removing the dummy gate structures, can result in fin erosion and damage. For example, the gate sidewall spacer etch steps may result in insufficient spacer removal between the fin structures, which can result in insufficient deposition surfaces for the epitaxial merge of the source and drain regions. Further, the dummy gate top corners may also be exposed by the spacer etch, which can result in the formation of epitaxial nodules. Epitaxial nodules occur during the epitaxial growth in the source and drain region, wherein the gate conductor that consists of polycrystalline silicon if not fully encapsulated by silicon nitride spacer provides the site for epitaxial growth on the gate conductor to result in the formation of epitaxial nodules, as well as leading to gate conductor to source and drain region shorts.

In some embodiments, the methods and structures that are disclosed herein provide that the source and drain epitaxial merge structures, the gate structure and gate sidewall spacer are all defined by a single sidewall image transfer technique. For example, in some embodiments, the gate area, i.e., gate structure and gate dielectric, can be defined by a mandrel portion of a sacrificial structure, while the epitaxial source and drain merge portions will be defined by the non-mandrel spacing between two gate sidewall spacers, and the gate sidewall spacers will be defined by the sidewall image transfer (SIT) spacer, i.e., gate mask portion of the sacrificial structure, that is present on the sidewalls of the mandrel portion. By employing a single sidewall image transfer technique, the fin erosion that results from the etch processes for removing a dummy gate structure and gate sidewall spacer formation of typical finFET formation methods can be reduced. Further, the methods and structures disclosed herein reduce the concentration of defects in the source and drain epitaxial merge regions, and minimizes the formation of epitaxial nodules at the gate corners. In some embodiments, the structures and methods disclosed herein provide an integration scheme where the gate structure, the gate sidewall spacer and the source and drain epitaxial merge regions are defined by the same patterning process. The methods and structures of the present disclosure are now described in more detail with reference to FIGS. 1-15.

Figure 1B:
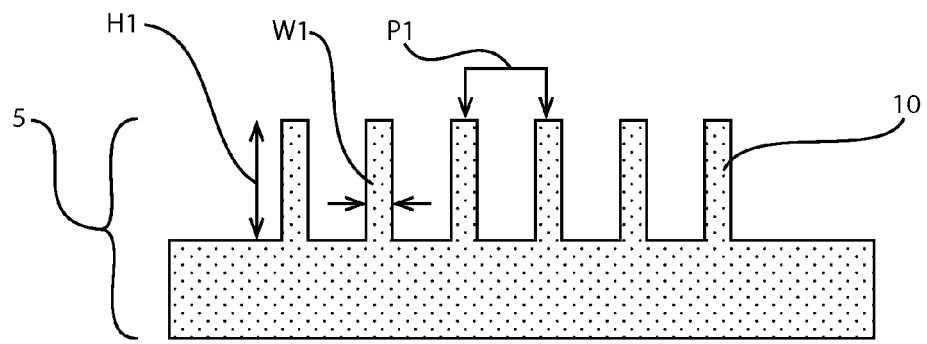
FIG. 1B is a side cross-sectional view along section line A-A of the structure depicted in FIG. 1A.

FIGS. 1A and 1B depict one embodiment of forming a plurality of fin structures 10 from a bulk semiconductor substrate 5. A "bulk semiconductor substrate" is a substrate that is composed of a single semiconductor material. A bulk semiconductor substrate 5 does not include a buried dielectric layer that is typically present in silicon on insulator (SOI) substrates. The semiconductor material that provides the bulk semiconductor substrate 5 may be a semiconducting material including, but not limited to, silicon, strained silicon, a silicon carbon alloy (e.g., silicon doped with carbon (Si:C), silicon germanium, a silicon germanium and carbon alloy (e.g., silicon germanium doped with carbon (SiGe:C), silicon alloys, germanium, germanium alloys, gallium arsenic, indium arsenic, indium phosphide, as well as other III/V and II/VI compound semiconductors.

The plurality of fin structures 10 may be formed from the bulk semiconductor substrate 5 using photolithography and etch processes. As used herein, the term "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. In one example, to form the fin structures 10, a photoresist mask is formed overlying the bulk semiconductor substrate 5, in which the portion of the bulk semiconductor substrate 5 that is underlying the photoresist mask provides the plurality of fin structures 10. The portion of the bulk semiconductor substrate 5 that is not protected by the photoresist mask is removed using a selective etch process. To provide the photoresist mask, a photoresist layer is first positioned on the bulk semiconductor substrate 5. The photoresist layer may be provided by a blanket layer of photoresist material that is formed utilizing a deposition process such as, e.g., plasma enhanced CVD (PECVD), evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer. Following the formation of the photoresist mask, an etching process may remove the unprotected portions of the bulk semiconductor substrate 5 selectively to the photoresist mask. For example, the transferring of the pattern provided by the photoresist into the underlying structures may include an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation. The etch process may be timed to determine the height $H_1$ of the fin structures 10.

Each of the fin structures 10 may have a height $H_1$ ranging from 5 nm to 200 nm. In another embodiment, each of the fin structures 10 has a height $H_1$ ranging from 10 nm to 100 nm. In one example, each of the fin structures 10 has a height $H_1$ ranging from 20 nm to 50 nm. Each of the plurality of fin structures 10 may have a width $W_1$ of less than 20 nm. In another embodiment, each of the fin structures 10 has a width $W_1$ ranging from 3 nm to 8 nm. Although six fin structures 10 are depicted in FIGS. 1A and 1B, the present disclosure is not limited to only this example. It is noted that any number of fin structures 10 may be formed from the bulk semiconductor substrate 5. The pitch $P_1$ separating adjacent fin structures in the plurality of fin structures 10 may range from 15 nm to 200 nm. In another example, the pitch $P_1$ separating adjacent fin structures 10 may range from 15 nm to 100 nm.

Figure 2A:
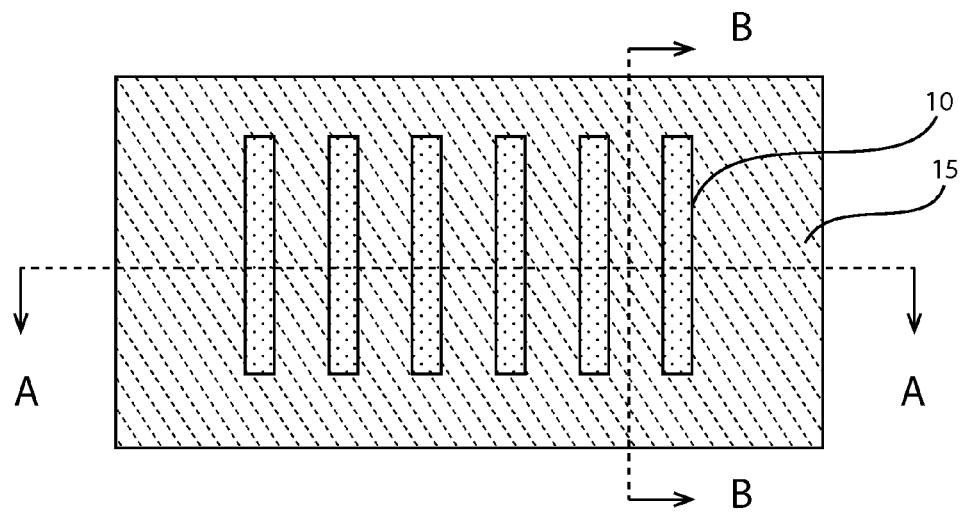
FIG. 2A is a top down view depicting forming isolation regions adjacent to the fin structures, in accordance with one embodiment of the present disclosure.
Figure 2B:
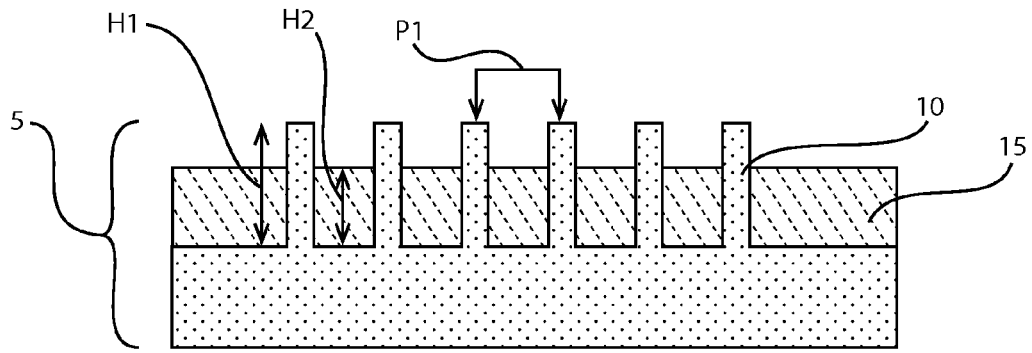
FIG. 2B is a side cross-sectional view along section line A-A of the structure depicted in FIG. 2A, which is hereafter referred to as a cross-section perpendicular to the length of the fin structures.
Figure 2C:
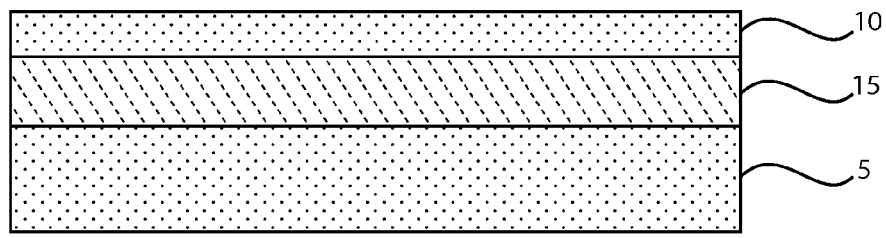
FIG. 2C is a side cross-sectional view along section line B-B of the structure depicted in FIG. 2A, which is hereafter referred to as a cross-section parallel to the length of the fin structures.

FIGS. 2A-2C depict one embodiment of forming isolation regions 15 adjacent to the fin structures 10. In some embodiments, the isolation regions 15 may be composed of a dielectric material, such as an oxide, nitride or oxynitride dielectric. For example, in some embodiments, when the isolation regions 15 are composed of an oxide, the oxide may be silicon oxide ($SiO_2$), and when the isolation regions 15 are composed of a nitride, the nitride may be silicon nitride ($Si_3N_4$). Other examples of materials that may be employed for the isolation regions 15 include silicon oxynitride, hafnium oxide, hafnium oxynitride, alumina and combinations thereof. The isolation regions 15 may also be formed using CVD, PECVD, high-density plasma CVD (HPCVD), chemical solution deposition or a spin-on glass process. In some embodiments, following deposition, the material of the isolation regions 15 may be recessed by an etch process, such as an anisotropic or isotropic etch process. For example, the isolation regions 15 may be recessed using reactive ion etch. The isolation regions 15 may be recessed to have a height $H_2$ that is less than half the height $H_1$ of the fin structures 10. In some embodiments, the isolation regions 15 may be recessed to have a height $H_2$ that is less than a quarter of the height of the fin structures 10.

Figure 3:
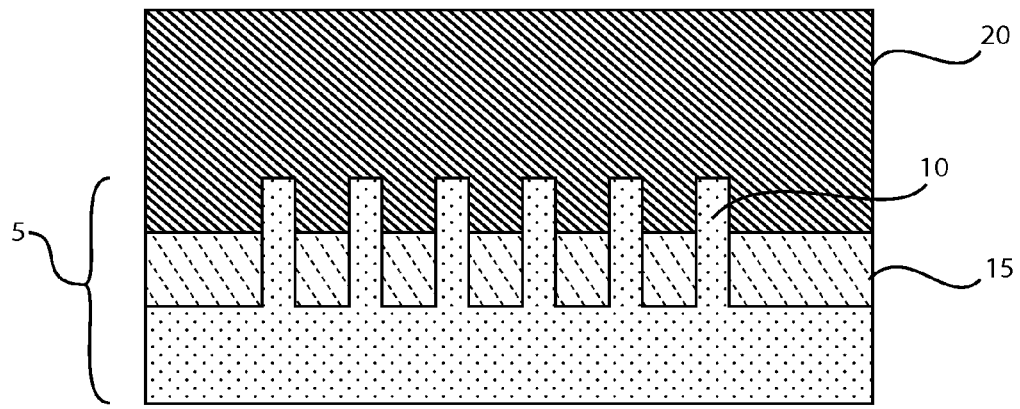
FIG. 3 is a side cross-sectional view perpendicular to the fin structures, i.e., as along section line A-A in FIG. 1B, depicting forming a dielectric layer on the fin structures, in accordance with the present disclosure.

FIG. 3 depicts one embodiment of forming at least one dielectric layer 20 on the fin structures 10 and the isolation regions 15. In some embodiments, the composition of the at least one dielectric layer 20 is selected to provide the composition of the later formed gate sidewall spacers that are present on the sidewalls of the gate structure that is subsequently formed on the channel region portion of the fin structures 10. In some embodiments, the composition of the at least one dielectric layer 20 is selected so that it may be removed selectively to the material of the fin structures 10, and the material of the isolation regions 15. In some embodiments, the at least one dielectric layer 20 may be composed of a dielectric material, such as an oxide, nitride or oxynitride dielectric. For example, in some embodiments, when the at least one dielectric layer 20 is composed of an oxide, the oxide may be silicon oxide ($SiO_2$), and when the at least one dielectric layer 20 is composed of a nitride, the nitride may be silicon nitride ($Si_3N_4$). Other examples of materials that may be employed for the at least one dielectric layer 20 include silicon oxynitride, hafnium oxide, hafnium oxynitride, alumina and combinations thereof. In some other examples, the at least one dielectric layer 20 may be comprised of silicon carbides (SiCN), silicon carbonitrides, silsequioxanes, siloxanes, boron phosphate silicate glass (BPSG) and combinations thereof. In one example, when the fin structures 10 are composed of silicon (Si) and the isolation regions 15 are composes of silicon oxide ($SiO_2$), the at least one dielectric layer 20 may be composed of silicon nitride ($Si_3N_4$).

In some embodiments, the at least one dielectric layer 20 may be formed using a deposition process, such as chemical vapor deposition (CVD). Variations of CVD processes that are suitable for forming the at least one dielectric layer 20 include, but are not limited to, atmospheric pressure CVD (APCVD), low pressure CVD (LPCVD) and plasma enhanced CVD (PECVD), metal organic CVD (MOCVD) and combinations thereof may also be employed. The at least one dielectric layer 20 may also be formed using thermal growth, such as oxidation and/or nitridation, chemical solution deposition or a spin-on glass process.

The at least one dielectric layer 20 may be a single layer or a multi-layered structure. The thickness of the at least one dielectric layer 20 is typically selected to provide a height of the gate sidewall spacer. For example, the thickness of the at least one dielectric layer 20 may range from 20 nm to 50 nm. In another example, the at least one dielectric layer 20 may have a thickness ranging from 30 nm to 40 nm.

Figure 4A:
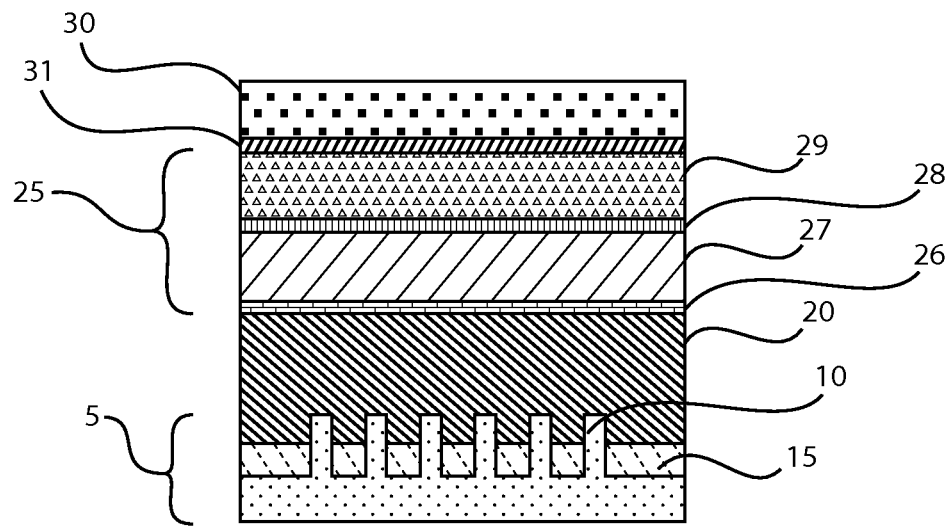
FIG. 4A is a side cross-sectional view perpendicular to the fin structures depicting forming a material layer stack for a sacrificial structure for defining a gate structure and gate sidewall spacers, in accordance with one embodiment of the present disclosure.
Figure 4B:
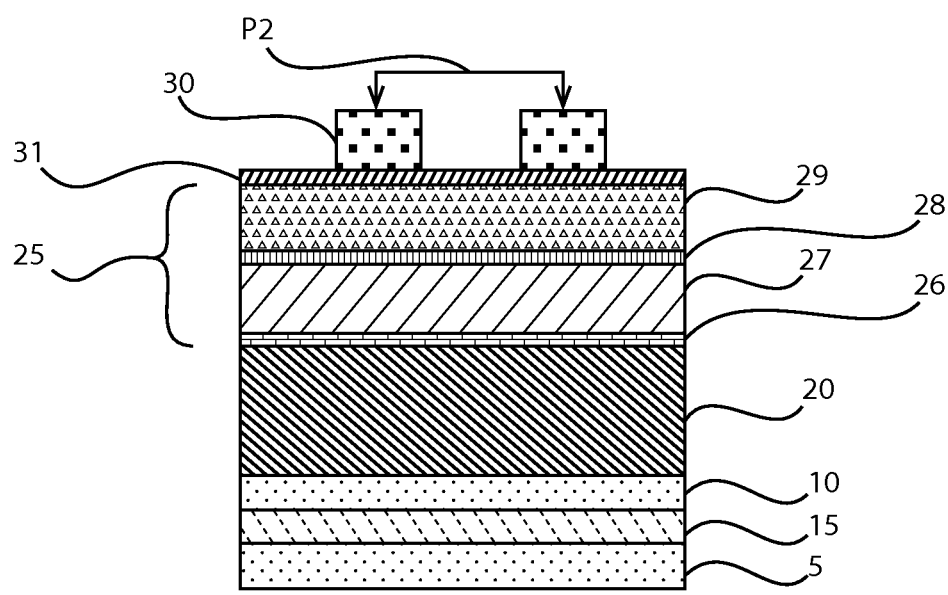
FIG. 4B is a side cross-sectional view parallel to the fin structures of the structure depicted in FIG. 4A.

FIGS. 4A and 4B depict one embodiment of forming a material layer stack 25 (hereafter referred to as "SIT material layer stack 25") for sidewall image transfer (SIT) processing on the at least one dielectric layer 20. The SIT material layer stack 25 is subsequently processed to provide the sacrificial structure including the mandrel portion and the spacer mask portion. By "sacrificial" it is meant that the structure is used in forming the semiconductor devices disclosed herein, but is not present in the final device structure. In some embodiments, the SIT material layer stack 25 may include an oxide containing layer 26, an amorphous semiconductor containing layer 27, a metal nitride layer 28, and an organic planarizing layer 29. It is noted that the SIT material layer stack 25 that is described above is only one example of a material layer stack suitable for use with the methods and structures disclosed herein. The present disclosure is not limited to only this example, as other compositions have also been contemplated for use with the SIT material layer stack 25. Additionally, other material layers may be incorporated into the SIT material layer stack 25 that are not specifically depicted in FIGS. 4A and 4B. Further, one or more of the material layers that are depicted in the SIT material layer stack 25 may be omitted.

In one embodiment, the oxide containing layer 26 may be composed of silicon oxide ($SiO_2$) or silicon oxynitride. The oxide containing layer 26 may be formed using thermal growth or deposition processes. For example, the oxide containing layer 26 may be formed using thermal oxidation, which includes annealing in an oxygen containing environment. In other examples, the oxide containing layer 26 may be formed using CVD, such as PECVD. The oxide containing layer 26 may have a thickness ranging from 1 nm to 10 nm. In some examples, the oxide containing layer 26 has a thickness ranging from 2 nm to 5 nm.

In one embodiment, the amorphous semiconductor containing layer 27 may be composed of amorphous hydrogenated silicon (a-Si:H). In one embodiment, an amorphous semiconductor material is a non-crystalline material that lacks the long-range order characteristic of a crystal. Other examples of amorphous semiconductors that are suitable for the amorphous semiconductor containing layer 27 may include diamond-like carbon (DLC, also known as amorphous hydrogenated carbon, $\alpha$-C:H), $\alpha$-Ge:H, $\alpha$-SiGe:H, $\alpha$-SiC:H, $\alpha$-SiO:H, $\alpha$-SiN:H and combinations thereof, wherein '$\alpha$' is amorphous and 'H' is hydrogenated. The amorphous semiconductor containing layer 27 may be deposited using a CVD process, such as atmospheric pressure CVD (APCVD), low pressure CVD (LPCVD) and plasma enhanced CVD (PECVD), metal organic CVD (MOCVD) or combinations thereof. The amorphous semiconductor containing layer 27 may also be formed using chemical solution deposition or a spin-on glass process. The amorphous semiconductor containing layer 27 may have a thickness ranging from 5 nm and 80 nm. In another example, the amorphous semiconductor containing layer 27 has a thickness ranging from 10 nm to 70 nm.

The metal nitride layer 28 may be composed of TiAl, TaN, TiN, HfN or combinations thereof. The metal nitride layer 28 may be deposited using a physical vapor deposition (PVD) process, such as sputtering and/or plating. Examples of sputtering apparatus that may be suitable for depositing the n-type work function metal layer include DC diode type systems, radio frequency (RF) sputtering, magnetron sputtering, and ionized metal plasma (IMP) sputtering. In one example, in which the metal nitride layer 28 is composed of titanium nitride (TiN), the TiN is sputtered from a solid titanium target, in which the nitrogen content of the metal nitride layer 28 is introduced by a nitrogen gas. In addition to physical vapor deposition (PVD) techniques, the metal nitride layer 28 may also be formed using chemical vapor deposition (CVD) and atomic layer deposition (ALD). The metal nitride layer 28 may have a thickness ranging from 1 nm to 10 nm. In some examples, the metal nitride layer 28 has a thickness ranging from 2 nm to 5 nm.

The organic planarizing layer 29 or a layer of material that is capable of providing planarization may be formed through deposition. The organic planarization layer 29 is typically composed of a polymer. For example, when metal nitride layer 28 is composed of titanium nitride (TiN), the organic planarization layer 29 may be an amorphous carbon layer. The organic planarization layer 29 may be deposited using spin on deposition or chemical solution deposition. The organic planarization layer 29 may have a thickness ranging from 10 nm to 400 nm. In another embodiment, the organic planarization layer 29 may have a thickness ranging from 50 nm to 100 nm. In some embodiments, following deposition, the organic planarization layer 29 may be planarized by a process, such as chemical mechanical planarization, to provide an upper surface that is substantially planar.

In one embodiment, the SIT material layer stack 25 may include an oxide containing layer 26 of silicon oxide, an amorphous semiconductor containing layer 27 of amorphous hydrogenated silicon, a metal nitride layer 28 of titanium nitride, and an organic planarizing layer 29 of amorphous carbon.

Still referring to FIGS. 4A and 4B, in some embodiments, an etch mask 30 may be formed over the SIT material layer stack 25. The etch mask 30 may be positioned on the portions of the SIT material layer stack 25 that are overlying the channel region portion of the fin structures 10. The etch mask 30 is positioned to define the mandrel portion of the sacrificial structure, which dictates the pitch for the subsequently formed gate structures, i.e., gate structure pitch. The gate structure pitch is the center to center distance separating adjacent gate structures to the adjacent fin structures 10. The mandrel portion of the sacrificial structure also dictates the dimensions and geometry of the gate structure. As will be described in more detail below, the spacer mask portion of the sacrificial structure is formed on the sidewall of the mandrel portion of the sacrificial structure. The spacer mask portion dictates the positioning, geometry and dimensions of the later formed gate sidewall spacers. Therefore, because the structure, i.e., the spacer mask portion, that dictates the geometry and positioning of the gate sidewall spacers is formed in direct contact with the structure, i.e., the mandrel portion, that dictates the positioning and geometry of the gate structure, the gate sidewall spacers are self-aligned to the gate structure. Further, as will be described in further detail below, the gate sidewall spacers dictates the positioning of the fin structure sidewalls that the epitaxial source and drain merge regions are formed on. The epitaxial source and drain merge regions are self aligned to the gate sidewall spacers. Therefore, because the gate sidewall spacers are self aligned to the gate structure, and the epitaxial source and drain merge regions are self aligned to the gate sidewall spacers, the epitaxial source and drain merge regions are self aligned to the gate structure.

In some embodiments, the alignment of the gate structure, the gate sidewall spacers and the epitaxial source and drain merge regions are based on the formation of the mandrel portion of the sacrificial structure from the SIT material layer stack 25 that is formed using the single etch mask 30 that is depicted in FIGS. 4A and 4B. The term "single etch mask" as used to describe the process sequence for forming the gate structure, gate sidewall spacer, and epitaxial source and drain merge regions means that only one photoresist mask is used in the formation of these structures. By reducing the number of photoresist masks, and corresponding subsequent etch processes, the methods and structures disclosed herein can reduce the fin erosion that typically results from the etch processes for removing a dummy gate structure and gate sidewall spacer formation as used in prior finFET formation methods. Further, the methods and structures disclosed herein reduce the concentration of defects in the source and drain epitaxial merge regions, and minimizes the formation of epitaxial nodules at the gate corners.

In some embodiments, prior to forming the etch mask 30, an anti-reflection coating 31 is formed on the upper surface of the SIT material layer stack 25, e.g., is formed on the upper surface of the organic planarization layer 29. The anti-reflection coating 31 may include silicon (Si) and thus may be referred to as a "SiARC layer". The anti-reflection coating 31 may be deposited using spin on deposition, and may have a thickness ranging from 20 nm to 100 nm.

Forming the etch mask 30 may include deposition, photolithography and development processes. For example, the etch mask 30 may be provided by a blanket layer of photoresist material that is formed utilizing a deposition process such as, e.g., chemical vapor deposition, plasma enhanced chemical vapor deposition, evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer.

Along a cross-section that is parallel to the length of the fin structures, the pitch P2, i.e., center to center distance of a repeating structure of the etch mask may range from 40 nm to 80 nm, as depicted in FIG. 4B. In another embodiment, the pitch P2 of the repeating structure of the etch mask may range from 50 nm to 70 nm.

Figure 5A:
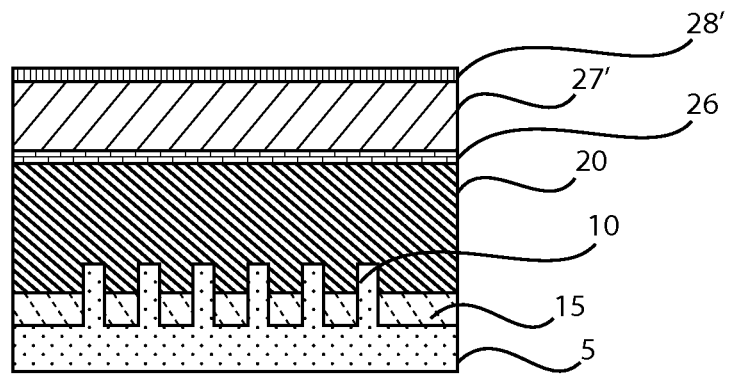
FIG. 5A is a side cross-sectional view perpendicular to the fin structures of patterning a mandrel portion of the sacrificial structure, in accordance with one embodiment of the present disclosure.
Figure 5B:
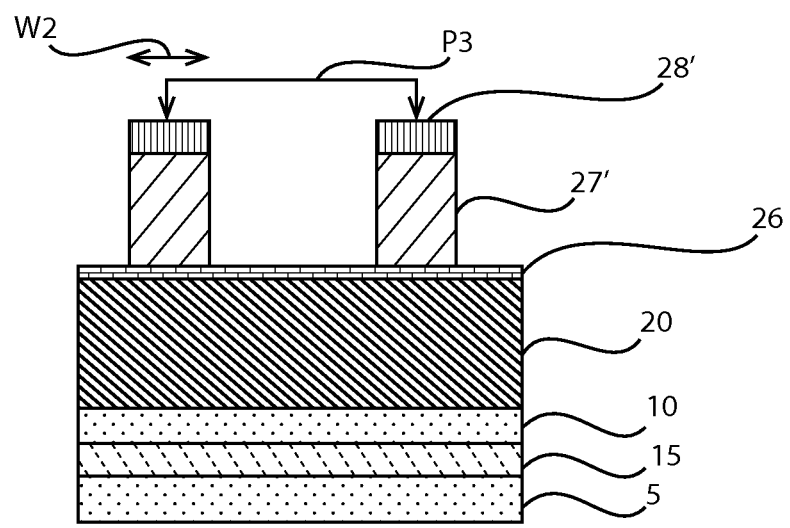
FIG. 5B is a side cross-sectional view parallel to the fin structures of the structure depicted in FIG. 5A.

FIGS. 5A and 5B depict one embodiment of patterning a mandrel portion 27', 28' of the sacrificial structure from the SIT material layer stack 25. In one embodiment, the SIT material layer stack 25 is patterned and etched selectively to the etch mask 30. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater, e.g., 1000:1. In one embodiment, the etch process for patterning the mandrel portion 27', 28' of the sacrificial structure from the SIT material layer stack 25 includes a first etch sequence for removing the exposed portions of the antireflective coating 31, the planarization layer 29, the metal nitride layer 28, and the amorphous semiconductor layer 27 selectively to the etch mask 30 and the oxide containing layer 26. In some embodiments, the etch process for patterning the mandrel portion 27', 28' of the sacrificial structure from the SIT material layer stack 25 includes an anisotropic etch process. One example of an anisotropic etch process for forming the mandrel portion 27', 28' of the sacrificial structure from the SIT material layer stack 25 includes reactive ion etching. Reactive ion etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present disclosure include ion beam etching, plasma etching or laser ablation.

In some embodiments, the etch process sequence for forming the mandrel portion 27', 28' of the SIT material layer stack 25 removes the etch mask 30, the antireflective coating 31, and the planarization layer 29 in their entirety. The mandrel portion 27', 28' of the SIT material layer stack 25 includes a remaining portion of the metal nitride layer 28' and a remaining portion of the amorphous semiconductor layer 27'. In some embodiments, the mandrel portion 27', 28' of the SIT material layer stack 25 has a width W2 ranging from 20 nm to 30 nm. Along a cross-section that is parallel to the length of the fin structures the pitch P3 separating adjacent mandrel portions 27', 28' of the SIT material layer stack 25 may range from 40 nm to 80 nm.

Figure 6A:
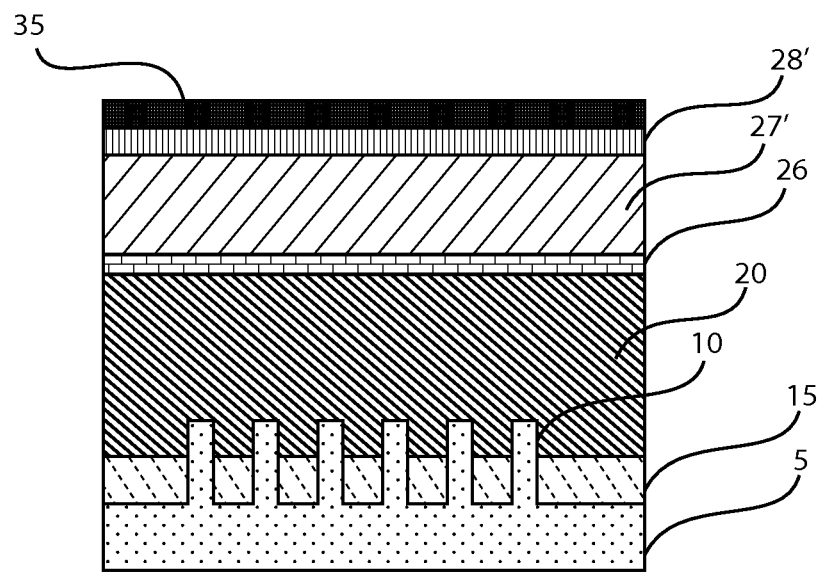
FIG. 6A is a side cross-sectional view perpendicular to the fin structures of forming a spacer mask portion of the sacrificial structure, in accordance with one embodiment of the present disclosure.
Figure 6B:
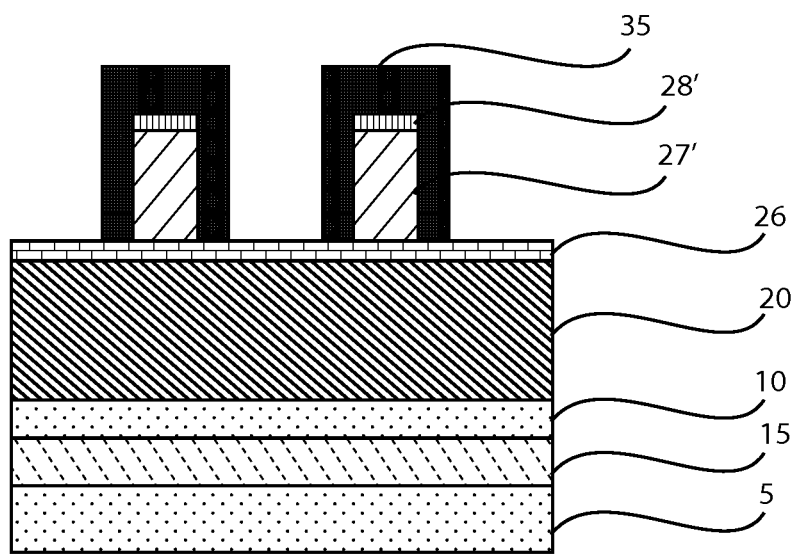
FIG. 6B is a side cross-sectional view parallel to the fin structures of the structure depicted in FIG. 6A.

FIGS. 6A and 6B depict one embodiment of forming a spacer mask portion 35 of the sacrificial structure on the mandrel portion 27', 28' of the sacrificial structure. The spacer mask portion 35 is typically formed on at least the sidewalls of the mandrel portion 27', 28' of the sacrificial structure. In some embodiments, a portion of the spacer mask portion 35 is typically formed on an upper surface of the mandrel portion 27', 28' of the sacrificial structure. The spacer mask portion 35 may be a conformally deposited continuous layer that is present on the sidewalls and upper surface of the mandrel portion 27', 28' of the sacrificial structure. The term "conformal" denotes a layer having a thickness that does not deviate from greater than or less than 30% of an average value for the thickness of the layer. The thickness of the spacer mask portion 35 that is present on the sidewalls of the mandrel portion 27', 28' of the sacrificial structure typically dictates the width of the subsequently formed gate sidewall spacers. In some embodiments, to provide gate sidewall spacers having a width ranging from 2 nm to 5 nm, the thickness of the spacer mask portion 35 may range from 2 nm to 5 nm. The spacer mask portion 35 may be composed of a metal nitride containing material. For example, the spacer mask portion 35 may be composed of WN, TaN, TiN, HfN or combinations thereof. The composition of the spacer mask portion 35 may be the same of different from the composition of the remaining portion of the metal nitride layer 28' in the mandrel portion 27', 28' of the sacrificial structure. The spacer mask portion 35 may be formed using physical vapor deposition processes, such as plating and/or sputter, or may be formed using chemical vapor deposition processes, such as plasma enhanced chemical vapor deposition and/or atomic layer deposition. In one example, the spacer mask portion 35 is composed of titanium nitride that is formed using atomic layer deposition (ALD).

FIGS. 6A and 6B further depict etching the deposited material layer that provides the spacer mask portion 35 so that a remaining portion of the spacer mask portion 35 remains only on the sidewalls and optionally the upper surface of the mandrel portion 27', 28' of the sacrificial structure. The horizontal portions of the deposited material layer that provides the spacer mask portion 35 that is present on the upper surface of the oxide containing layer 26 may be removed by an etch process, such as anisotropic etch, e.g., reactive ion etch (RIE). It is noted that a portion of the material layer that provides the spacer mask portion 35 may be present on the upper surface of the mandrel portion 27', 28' of the sacrificial structure following the etch process that removes the horizontal portions of the material layer for the spacer mask portion 35 on the oxide containing layer 26. In other embodiments, the portion of the material layer that provides the spacer mask portion 35 that is present on the upper surface of the mandrel portion 27', 28' of the sacrificial structure is removed. In this embodiment, the spacer mask portion 35 is present only on the sidewalls of the mandrel portion 27', 28' of the sacrificial structure, and the remaining portion of the metal nitride layer 28' is exposed as the upper surface of the sacrificial structure.

Figure 7A:
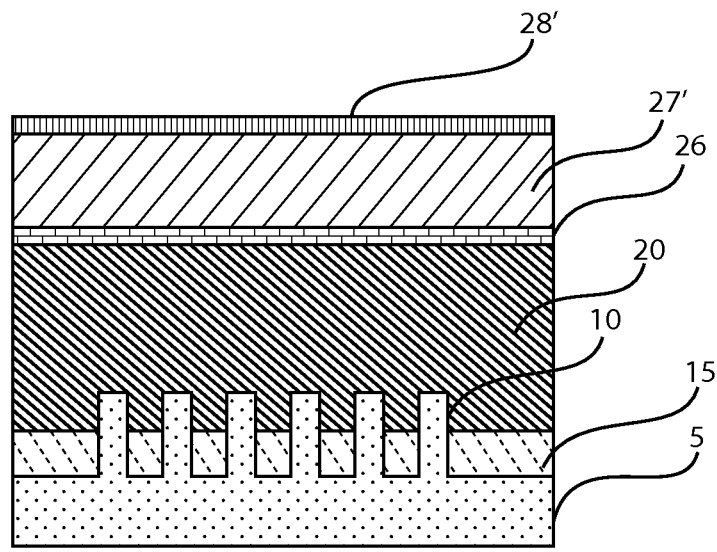
FIG. 7A is a side cross-sectional view perpendicular to the fin structures depicting etching the dielectric layer using the sacrificial structure as an etch mask, in accordance with one embodiment of the present disclosure.
Figure 7B:
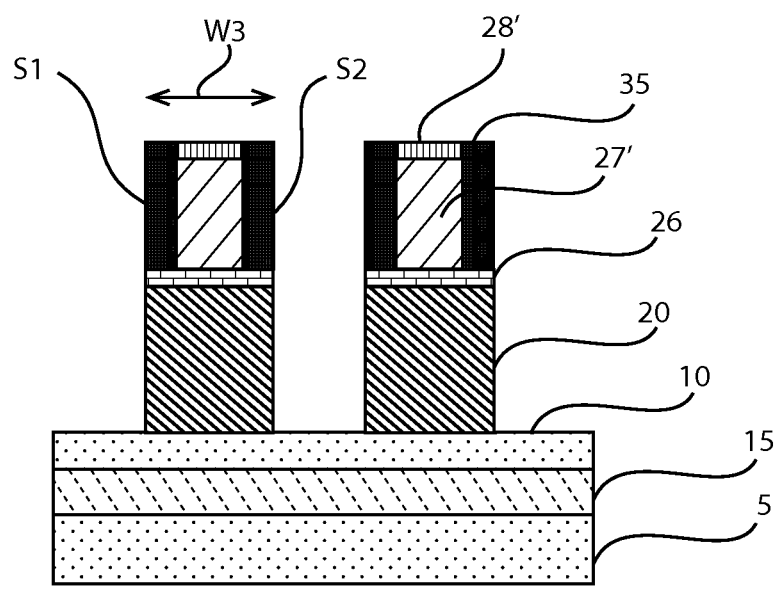
FIG. 7B is a side cross-sectional view parallel to the fin structures of the structure depicted in FIG. 7A.

FIGS. 7A and 7B depict one embodiment of etching the at least one dielectric layer 20 using the sacrificial structure as an etch mask. In some embodiments, the width W3 extending from an exterior sidewall S1 of spacer mask portion 35 on one side of the mandrel portion 27', 28' to the exterior sidewall S2 of the spacer mask portion 35 on the other side of the mandrel portion 27', 28' provides the exterior dimensions of the gate sidewall spacer. In some embodiments, the etch process for etching the at least one dielectric layer 20 also removes the exposed portions of the oxide containing layer 26. In some embodiments, the etch process removes the material of the at least one dielectric layer 20 and the oxide containing layer 26 selectively to the material of the spacer mask portion 35. The etch process may be an anisotropic etch process, such as reactive ion etch (RIE), ion beam etching, plasma etching or laser ablation.

In some embodiments, etch process may continue to remove the exposed portions of the fin structures 10, and expose a sidewall portion of the fin structures 10 that is aligned with the outer sidewall of the gate sidewall spacers formed from the remaining portion of the at least one dielectric layer 20. For example, the exposed portions of the fin structures 10 may be removed selectively by an etch that is selective to the sacrificial structure and the isolation regions 15.

Figure 8:
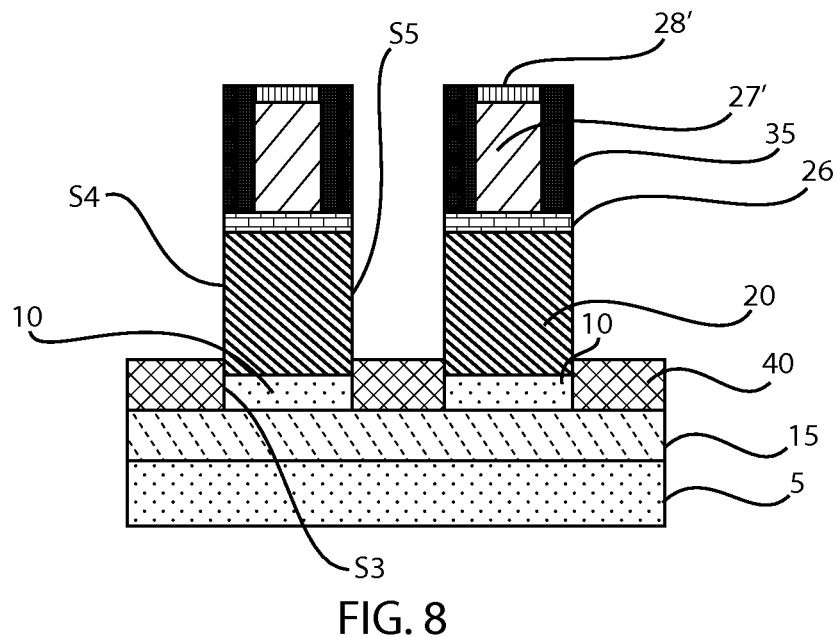
FIG. 8 is a side cross-sectional view parallel to the fin structures depicting one embodiment of etching exposed portions of the fin structures using the sacrificial structure as an etch mask to expose sidewalls of the fin structures, and forming source and drain regions on the sidewalls of the fin structures, in accordance with the present disclosure.

FIG. 8 depicts one embodiment of forming an epitaxial semiconductor material 40 on exposed sidewall S3 of the fin structure 5 that is aligned with the overlying etched sidewall S4, S5 of the remaining portion of the at least one dielectric layer 20. The epitaxial semiconductor material 40 provides an epitaxial source region and an epitaxial drain region that are present on opposing sides of the channel region portion of the fin structure 10. The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

In some embodiments, the epitaxial semiconductor material 40 is formed on the exposed sidewall S3 of at least one of a source region portion and a drain region portion of the fin structures 10. In some embodiments, epitaxial deposition of the epitaxial semiconductor material 40 is a selective deposition process. For example, although the epitaxially deposited the epitaxial semiconductor material 40 orientates to the crystal arrangement of a semiconductor material and is deposited thereon, such as the exposed sidewall surface S3 of the fin structures 10, the epitaxial semiconductor material 40 may not be deposited on a dielectric material. For example, the epitaxial semiconductor material 40 is not formed on the at least one dielectric layer 20, and the mandrel portion 27', 28' and the spacer mask portion 30 of the sacrificial structure.

In some embodiments, the epitaxial semiconductor material 40 may be composed of a silicon-containing material. For example, the epitaxial semiconductor material 40 may be composed of a base material entirely of silicon, i.e., not counting dopants for charge carriers. In other embodiments, the epitaxial semiconductor material 40 is composed of germanium, silicon germanium, a silicon germanium and carbon alloy (e.g., silicon germanium doped with carbon (SiGe:C), germanium alloys, gallium arsenic, indium arsenic, indium phosphide, as well as other III/V and II/VI compound semiconductors. Examples of silicon including source gasses may include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof.

Examples of germanium including source gasses for epitaxially forming the epitaxial semiconductor material 40 of a germanium containing semiconductor include germane, digermane, halogermane, dichlorogermane, trichlorogermane, tetrachlorogermane and combinations thereof.

Epitaxial deposition for forming the epitaxial semiconductor material 40 may be carried out in a chemical vapor deposition apparatus, such as a metal organic chemical vapor deposition (MOCVD) apparatus or a plasma enhanced chemical vapor deposition (PECVD) apparatus.

In some embodiments, the epitaxial semiconductor material 40 may be in-situ doped. By "doped" it is meant that the epitaxial semiconductor material 40 includes a p-type or n-type dopant present therein. For example, the concentration of the p-type or n-type dopant in the epitaxial semiconductor material 40 may range from $5 \times 10^{20}$ atoms/cm$^3$ to $8 \times 10^{20}$ atoms/cm$^3$. In another example, the concentration of the p-type or n-type dopant in the epitaxial semiconductor material 40 may range from $6 \times 10^{20}$ atoms/cm$^3$ to $7 \times 10^{20}$ atoms/cm$^3$. The term "in situ" denotes that the dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gasses.

In one embodiment, the n-type gas dopant source may include arsine (AsH$_3$), phosphine (PH$_3$) and alkylphosphines, such as with the empirical formula $R_xPH_{(3-x)}$, where R=methyl, ethyl, propyl or butyl and x=1, 2 or 3. Alkylphosphines include trimethylphosphine ((CH$_3$)$_3$P), dimethylphosphine ((CH$_3$)$_2$PH), triethylphosphine ((CH$_3$CH$_2$)$_3$P) and diethylphosphine ((CH$_3$CH$_2$)$_2$PH). The p-type gas dopant source may include diborane (B$_2$H$_6$). The source gas for the base material may be provided by germane, digermane, halogermane, silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof.

The epitaxial semiconductor material 40 typically provides epitaxial source and drain merge regions (also referred to as epitaxial source and drain merge structures) between adjacent fin structures. By "merge" it is meant that the epitaxial semiconductor material 40 may be in direct contact with two adjacent fin structures 10. As used herein, the term "drain" means a doped region in semiconductor device located at the end of the channel, in which carriers are flowing out of the transistor through the drain. As used herein, the term "source" is a doped region in the semiconductor device, in which majority carriers are flowing into the channel. The "channel" is the region of the underlying the gate structure and between the source and drain of a semiconductor device that becomes conductive when the semiconductor device is turned on.

In the embodiments in which the finFET device being formed has n-type source and drain regions, and is referred to as an n-type finFET, the doped epitaxial semiconductor material 40 is doped with an n-type dopant to have an n-type conductivity. In the embodiments in which the finFET device being formed has p-type source and drain regions, and is referred to as a p-type finFET, the doped epitaxial semiconductor material 40 is doped with a p-type dopant to have a p-type conductivity. As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous.

In some embodiments, the n-type or p-type dopant is diffused, i.e., driven, from the doped epitaxial semiconductor material 40 into a source and drain extension region in the fin structures 10. In one embodiment, the thermal annealing that diffuses the dopant from the doped epitaxial semiconductor material 40 into the extension region portions of the fin structures 10 includes an annealing process selected from the group consisting of rapid thermal annealing (RTA), flash lamp annealing, furnace annealing, laser annealing and combinations thereof. In one embodiment, the thermal annealing for driving the dopant, i.e., p-type or n-type dopant, from doped epitaxial semiconductor material 40 into the extension region portions of the fin structures 10 may include a temperature ranging from 800° C. to 1200° C., and a time period ranging from 10 milliseconds to 100 seconds.

Figure 9:
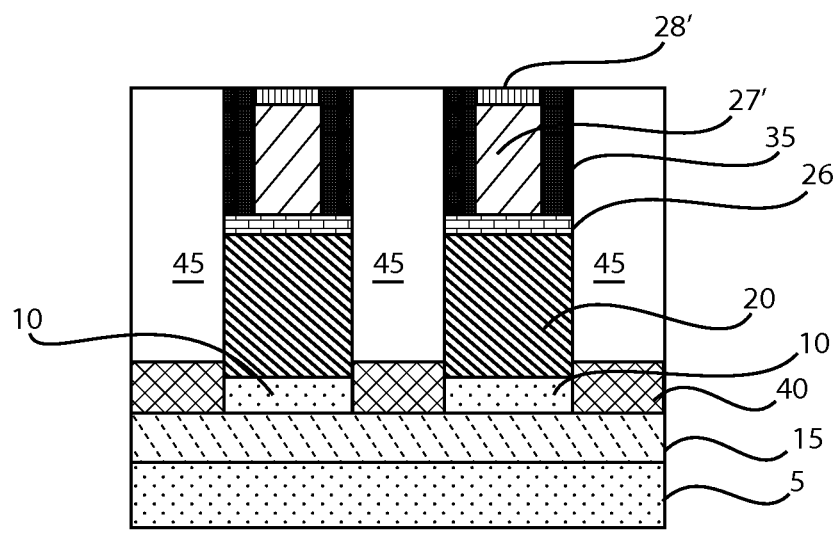
FIG. 9 is a side cross-sectional view parallel to the fin structures depicting one embodiment of forming a dielectric fill between adjacent pillars of dielectric material that remain following etching of the dielectric layer selectively to the sacrificial structures, in accordance with one embodiment of the present disclosure.

FIG. 9 depicts one embodiment of forming a dielectric fill 45 between adjacent pillars of dielectric material that remains following etching of the at least one dielectric layer 20 selectively to the mandrel portion 27', 28' and the spacer mask portion 35 of the sacrificial structure. The dielectric fill 45 may be an oxide containing material. For example, the dielectric fill 45 may be silicon oxide ($SiO_2$). Other examples of materials that may be employed for the dielectric fill 45 include silicon nitride, silicon oxynitride, hafnium oxide, hafnium oxynitride, alumina and combinations thereof. The dielectric fill 45 may be formed using CVD, PECVD, high-density plasma CVD (HPCVD), chemical solution deposition or a spin-on glass process. Following deposition, the material for the dielectric fill 45 may be planarized so that the upper surface of the dielectric fill 45 is coplanar with the upper surface of the upper surface of the sacrificial structure, i.e., remaining portion of the metal nitride layer 27' of the mandrel portion 27', 28'.

Figure 10:
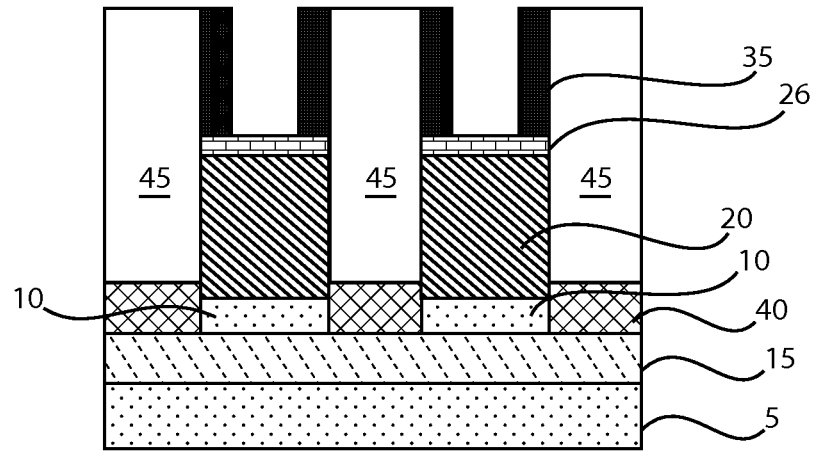
FIG. 10 is a side cross-sectional view parallel to the fin structures of removing the mandrel portion of the sacrificial structure, in accordance with one embodiment of the present disclosure.

FIG. 10 depicts one embodiment of removing the mandrel portion 27', 28 of the sacrificial structure. In some embodiments, the remaining portions of the metal nitride layer 27' and the amorphous semiconductor layer 28' that provide the mandrel portion 27', 28' of the sacrificial structure may be removed by an etch process that is selective to the dielectric fill 45, the spacer mask portion 35 of the sacrificial structure, and the oxide containing layer 26. The etch process for removing the amorphous semiconductor layer 28' may an anisotropic etch, such as reactive ion etch, or may be an isotropic etch, such as a wet chemical etch.

Figure 11:
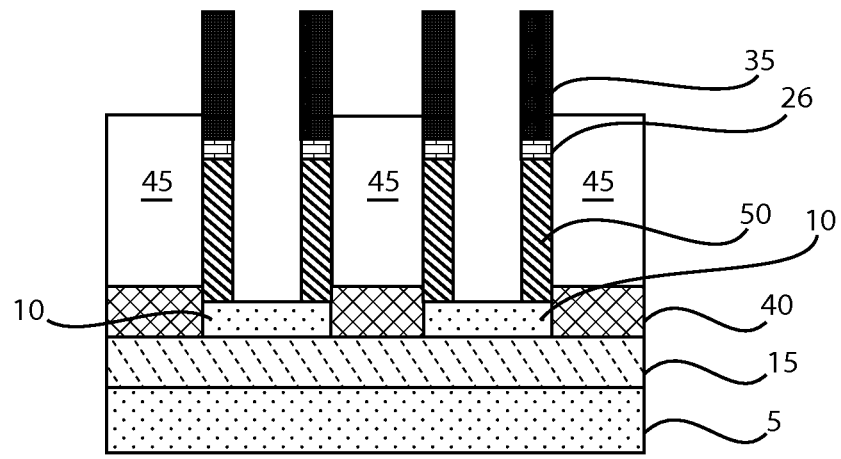
FIG. 11 is a side cross-sectional view parallel to the fin structures of etching the dielectric layer selectively to the spacer mask portion to form the gate sidewall spacer of the gate structure, in accordance with one embodiment of the present disclosure.

FIG. 11 depicts one embodiment of etching the remaining portion of the at least one dielectric layer 20 selectively to the spacer mask portion 35 of the sacrificial structure to form the dielectric sidewall spacer 50 of the subsequently formed gate structure. In some embodiments, the etch step for etching the remaining portion of the at least one dielectric layer 20 may also recess the dielectric fill 45. In one embodiment, the etch process for etching the remaining portion of the at least one dielectric layer 20 may be selective to the fin structures 20. The etch process for etching the remaining portion of the at least one dielectric layer 20 may be an anisotropic etch process. Examples of anisotropic etch processes that are suitable for use at this stage of the process flow include reactive ion etch, ion beam etching, plasma etching or laser ablation. The step of etching the remaining portion of the at least one dielectric layer using the spacer mask portion 35 of the sacrificial structure defines the interior sidewall of the dielectric sidewall spacer 50 and exposes the channel region portion of the fin structures 10. The width of the dielectric sidewall spacer 50 is substantially equal to the width of the spacer mask portion 35 of the sacrificial structure.

Figure 12:
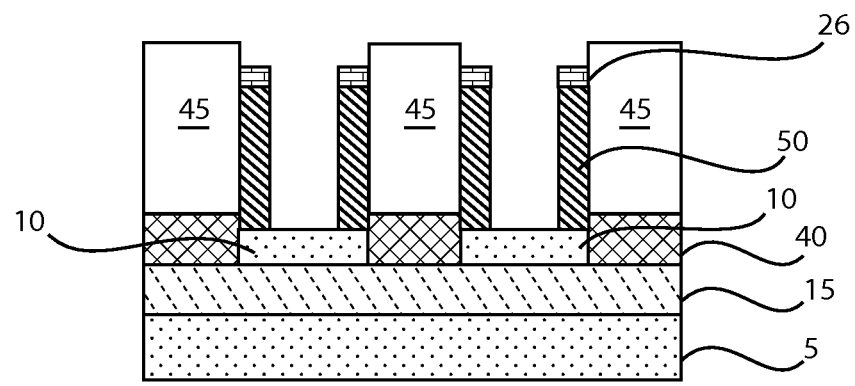
FIG. 12 is a side cross-sectional view parallel to the fin structures of removing the spacer mask portion of the sacrificial structure, in accordance with one embodiment of the present disclosure.

FIG. 12 depicts one embodiment of removing the spacer mask portion 35 of the sacrificial structure. In some embodiments, the spacer mask portion 35 may be removed by an etch process that is selective to at least the dielectric fill 45, the dielectric sidewall spacer 50 and the fin structures 10. In some embodiments, the spacer mask portion 35 may be removed by an anisotropic etch or isotropic etch.

Figure 13:
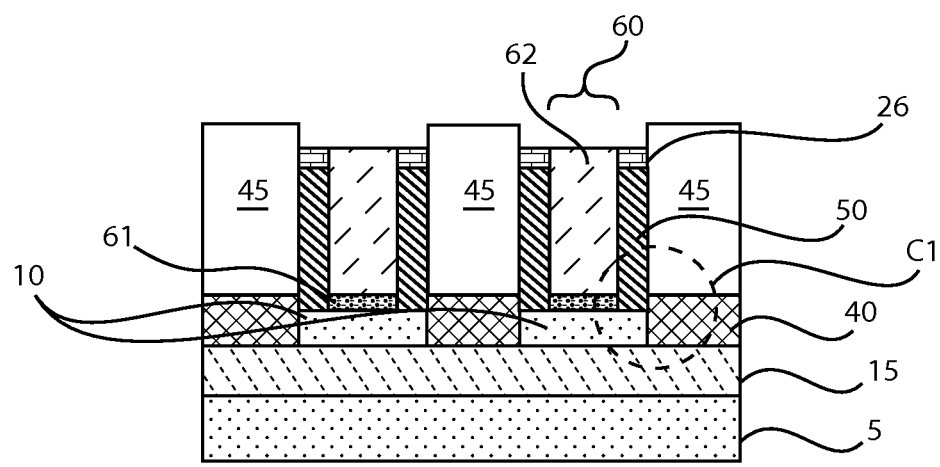
FIG. 13 is a side cross-section view parallel to the fin structures of forming gate structures on the channel region portion of the fin structures, in accordance with one embodiment of the present disclosure.

FIG. 13 depicts one embodiment of forming gate structures 60 on the channel region portions of the fin structures 10 between the gate sidewall spacers 50 for each of the finFET semiconductor devices 100. The term "gate structure" means a structure used to control output current (i.e., flow of carriers in the channel) of a semiconducting device through electrical or magnetic fields. In one embodiment, each of the finFET devices 100 includes a gate structure 60 that may be composed of at least one gate dielectric layer 61 and at least one gate conductor layer 62. The at least one gate dielectric layer 61 is composed of an insulator, and is present between the channel region portion of the fin structure 10 and the at least one gate conductor layer 62 of the gate structure 60.

The at least one gate dielectric layer 61 is typically positioned on at least a channel region portion of the fin structures 10. In some embodiments, the at least one gate dielectric layer 61 is also formed on the interior sidewalls of the gate sidewall spacer 50, to provide a U-shaped cross sectional geometry. The at least one gate dielectric layer 61 may be formed by a thermal growth process such as, e.g., oxidation, nitridation or oxynitridation. In other embodiments, the at least one gate dielectric layer 61 may be formed using a deposition process, such as CVD. In some embodiments, the at least one gate dielectric layer 61 is composed of a low-k dielectric material, such as silicon oxide ($SiO_2$), which typically has a dielectric constant of less than 4.0 at room temperature, e.g. 25° C. In some embodiments, the at least one gate dielectric 61 is composed of a high-k dielectric material. High-k dielectric materials have a dielectric constant greater than silicon oxide ($SiO_2$) at room temperature, e.g., 25° C. For example, a high-k dielectric composed of hafnium oxide ($HFO_2$), may have a dielectric constant of 4.0 or greater.

In one embodiment, the at least one gate dielectric layer 61 may include, but is not limited to, an oxide, nitride, oxynitride and/or silicates including metal silicates, aluminates, titanates and nitrides. In one example, when the at least one gate dielectric layer 61 is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the at least one gate dielectric layer 61 may vary, but typically, the at least one gate dielectric layer 61 has a thickness ranging from 1 nm to 10 nm.

The at least one gate conductor layer 62 may be composed of polysilicon, SiGe, a silicide, a metal or a metal-silicon-nitride, such as Ta—Si—N. Examples of metals that can be used as the at least one gate conductor layer 62 include, but are not limited to Al, W, Cu, Ti or other like conductive metals. In some embodiments, the at least one gate conductor layer 62 may be composed of a p-type work function metal layer and/or an n-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device, e.g., a finFET having p-type conductivity source and drain regions, towards a valence band of silicon in the silicon containing substrate of the p-type semiconductor device. A "valence band" is the highest range of electron energies where electrons are normally present at absolute zero.

In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof. In one embodiment, the p-type work function metal layer comprising titanium nitride (TiN) may be deposited by a physical vapor deposition (PVD) method, such as sputtering. Examples of sputtering apparatus that may be suitable for depositing the p-type work function metal layer include DC diode type systems, radio frequency (RF) sputtering, magnetron sputtering, and ionized metal plasma (IMP) sputtering. In addition to physical vapor deposition (PVD) techniques, the p-type work function metal layer may also be formed using chemical vapor deposition (CVD) and atomic layer deposition (ALD).

As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device, e.g., a finFET having n-type conductivity source and drain regions. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is composed of at least one of TiAl, TaN, TiN, HfN, HfSi, or combinations thereof. The n-type work function metal layer can be deposited using chemical vapor deposition (CVD), atomic layer deposition (ALD), sputtering or plating. In one embodiment, the n-type work function metal layer is composed of titanium aluminum (TiAl) and is deposited using sputtering. Examples of sputtering apparatus that may be suitable for depositing the n-type work function metal layer include DC diode type systems, radio frequency (RF) sputtering, magnetron sputtering, and ionized metal plasma (IMP) sputtering. In one example, an n-type work function metal layer composed of TiN is sputtered from a solid titanium target, in which the nitrogen content of the metal nitride layer is introduced by a nitrogen gas. In another example, an n-type work function metal layer composed of TiN is sputtered from a solid target comprised of titanium and nitrogen. In addition to physical vapor deposition (PVD) techniques, the n-type work function metal layer may also be formed using chemical vapor deposition (CVD) and atomic layer deposition (ALD). The at least one second gate structure 44 may be formed using deposition, photolithography and etch processes.

The material for the at least one gate conductor 62 may be deposited to fill the space over the channel region portion of the fin structure 10 within the interior sidewalls of the gate sidewall spacer 50. In some embodiments, a planarization process may be applied to the material deposited for the at least one gate conductor layer 62 so that an upper surface of the at least one gate conductor layer 62 is substantially coplanar with an upper surface of the gate sidewall spacer 50. The physical thickness of the at least one gate conductor layer 62 may range from 1 nm to 10 nm.

Figure 14:
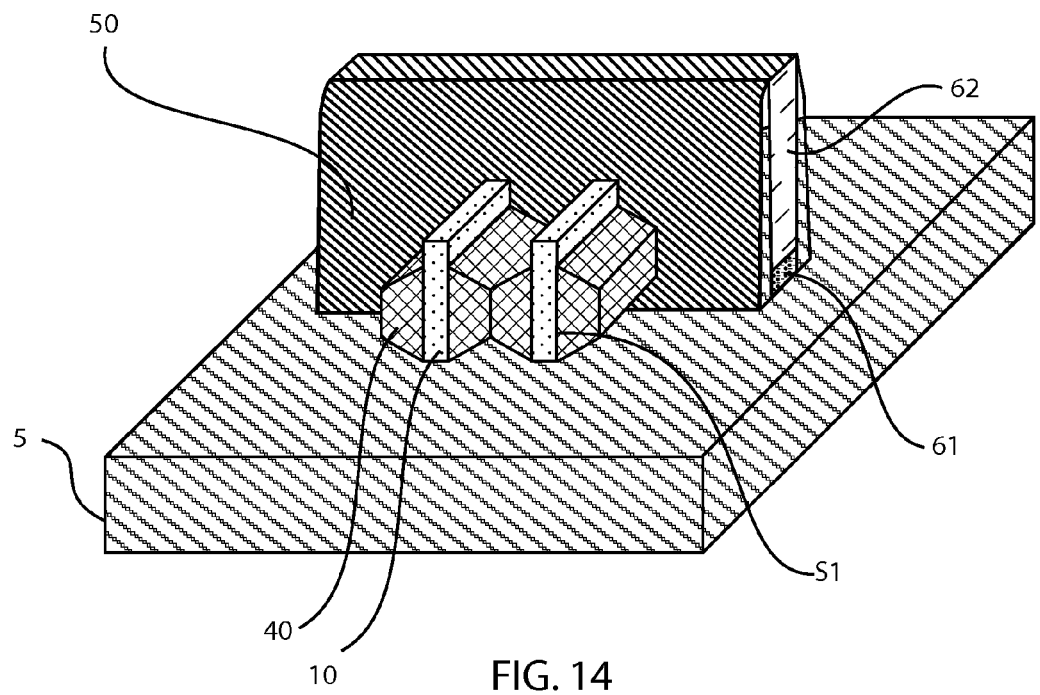
FIG. 14 is a perspective view of one embodiment of fin field effect transistors (finFETs) formed using the method depicted in FIGS. 1-13, in accordance with the present disclosure.

FIG. 14 is a perspective view of one embodiment of fin field effect transistors formed using the method depicted in FIGS. 1-13.

Following formation of the at least one gate conductor layer 62, contacts (also referred to as interconnects) may be formed to the source and drain regions, i.e., epitaxial source and drain merge regions 40, and the gate structures 60. In some embodiments, a layer of dielectric material can be blanket deposited atop the entire substrate and planarized. The blanket dielectric may be selected from the group consisting of silicon-containing materials, such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, $\alpha$-C:H). Additional choices for the blanket dielectric include any of the aforementioned materials in porous form, or in a form that changes during processing to or from being porous and/or permeable to being non-porous and/or non-permeable. The deposited dielectric is then patterned and etched to form via holes to the various source/drain, e.g., doped epitaxial semiconductor material 40, and gate conductor regions, e.g., the least one gate conductor layer 62 of the gate structure 60, of the device. Following via formation contacts (also referred to interconnects) are formed by depositing a conductive metal into the via holes using deposition methods, such as CVD or plating. The conductive metal may include, but is not limited to, tungsten, copper, aluminum, silver, gold and alloys thereof.

In one embodiment, the methods described above can provide a finFET semiconductor device that includes a gate structure 60 present on a channel region portion of a fin structure 10, wherein the gate structure 60 includes a gate sidewall spacer 50 contacting a sidewall of the at least one gate dielectric 61 and the at least one gate conductor 62. An epitaxial source region and an epitaxial drain region (provided by the epitaxial semiconductor material 40) is present on opposing sidewalls of the fin structure 10.

Figure 15:
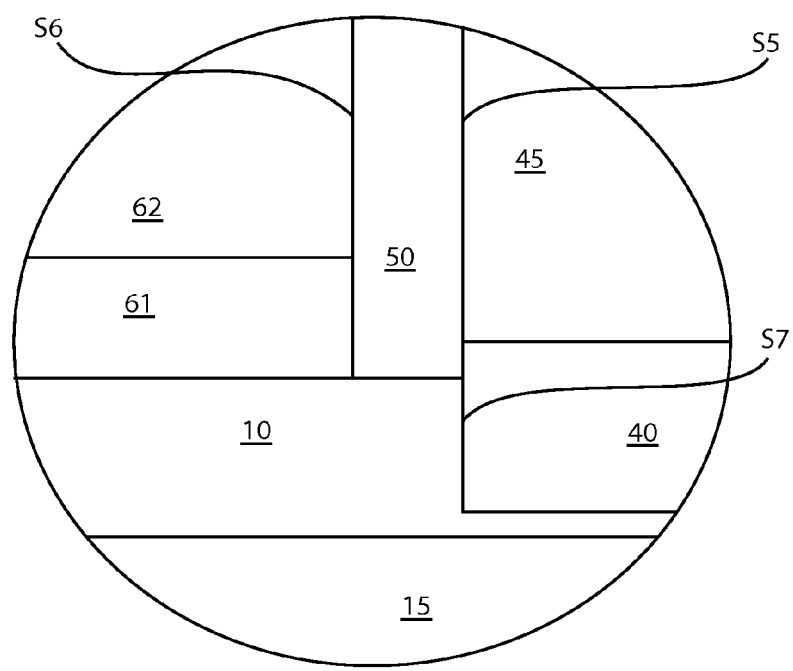
FIG. 15 is a magnified view of the section identified in FIG. 13.

FIG. 15 is a magnified view of section C1 in FIG. 13. FIG. 15 depicts that the sidewall surfaces S7 of the epitaxial source region and the epitaxial drain region, i.e., epitaxial semiconductor material 40, that are in contact with the sidewalls of the fin structure 10 are aligned with an outside surface S5 of the gate sidewall spacer 50. The gate structure 61, 62 is in direct contact with the interior sidewall S6 of the gate sidewall spacer 50. The gate structure 10, the gate sidewall spacers 50 and the epitaxial source and drain regions i.e., epitaxial semiconductor material 40, are formed using a single sidewall image transfer (SIT) process employing the mandrel portion 27', 28' of the sacrificial structure that is formed using the single etch mask 30 that is depicted in FIGS. 4A and 4B. Therefore, because a single etch mask 30 is used to form the gate structure 10, the gate sidewall spacers 50 and the epitaxial source and drain regions, i.e., epitaxial semiconductor material 40, the gate sidewall spacer 50, the gate dielectric 61, and the gate conductor 62 are self-aligned to one another.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor device comprising:
   depositing a dielectric layer over a fin structure;
   forming a sacrificial structure on a portion of the dielectric layer, said sacrificial structure including a mandrel portion and a spacer mask portion;
   forming source and drain structures on opposing sides of a portion of the fin structure that the sacrificial structure is present on;
   removing the mandrel portion of the sacrificial structure;
   etching the dielectric layer selective to the spacer mask portion, wherein a remaining portion of the dielectric layer provides a gate sidewall spacer on opposing sides of the fin structure; and
   forming a gate structure on a channel region portion of the fin structure, wherein the gate structure is in direct contact with the gate sidewall spacer.

2. The method of claim 1, wherein only a single photoresist mask is used in a sequence to form the gate structure, the gate sidewall spacer and the source and drain structures.

3. The method of claim 1, wherein the forming of the sacrificial structure on the dielectric layer comprises:
   forming the mandrel portion of a first material on the dielectric layer, wherein the mandrel portion is over the fin structure; and
   forming a conformal layer of a second material on at least sidewalls of the mandrel portion, wherein the conformal layer provides the spacer mask portion of the sacrificial structure, and the first material may be etched selectively to the second material.

4. The method of claim 3 further comprising etching the fin structure selectively to the mandrel structure.

5. The method of claim 4, wherein the forming of the mandrel portion of the first material comprises:
   depositing a semiconductor including material layer on the dielectric layer;
   forming a photoresist etch mask over the semiconductor including material layer;
   etching the semiconductor including material layer selectively to the photoresist etch mask and the dielectric layer; and
   removing the photoresist etch mask.

6. The method of claim 1, wherein the forming of the source and drain structures on opposing sides of the portion of the fin structure that the sacrificial structure is present on comprises epitaxial deposition of a semiconductor material that is in-situ doped to an n-type or p-type conductivity.

7. The method of claim 6, wherein the source and drain structures are formed on a sidewall portion of the fin structure.

8. The method of claim 1, wherein removing the mandrel portion of the sacrificial structure comprises an etch process that is selective to the spacer mask portion.

9. The method of claim 1, wherein the etching of the dielectric layer selective to the spacer mask portion comprises an anisotropic etch process that is also selective to the fin structure.

10. The method of claim 1, wherein the forming of the gate structure comprises forming a high-k gate dielectric on the channel region portion of the fin structure and forming a metal gate conductor on the high-k gate dielectric.

11. A method of forming a semiconductor device comprising:
    depositing a dielectric layer over a plurality of fin structures;
    forming a plurality of sacrificial structures on a portion of the dielectric layer, wherein each sacrificial structure of said plurality of sacrificial structures includes a mandrel portion and a spacer mask portion;
    etching the plurality of fin structures selectively to the plurality of sacrificial structures to expose a sidewall portion of the plurality of fin structures;
    forming source and drain structures on the sidewall portion of the plurality of fin structures;
    removing the mandrel portion of the plurality of sacrificial structures;
    etching the dielectric layer selective to the spacer mask portion, wherein a remaining portion of the dielectric layer provides gate sidewall spacers; and
    forming a gate structure on the channel region portion of the plurality of fin structures, wherein the gate structure is in contact with the gate sidewall spacers.

12. The method of claim 11, wherein only a single photoresist mask is used in a sequence to form the gate structure, the gate sidewall spacers and the source and drain structures.

13. The method of claim 11, wherein the forming of the plurality of sacrificial structures on the portion of the dielectric layer comprises:
    forming the mandrel portion of a first material of the sacrificial structure on the dielectric layer, wherein the mandrel portion is over the fin structure; and
    forming a conformal layer of a second material on at least sidewalls of the mandrel portion, wherein the conformal layer provides the spacer mask portion of the sacrificial structure, and the first material may be etched selectively to the second material.

14. The method of claim 13, wherein removing the mandrel portion of the plurality of sacrificial structures comprises an etch process that is selective to the spacer mask portion, and wherein the etching of the dielectric layer selective to the spacer mask portion comprises an anisotropic etch process that is also selective to the plurality of fin structures.

15. The method of claim 13, wherein the forming of the gate structure on the plurality of fin comprises forming a high-k gate dielectric on the channel region portion of the plurality of fin structures and forming a metal gate conductor on the high-k gate dielectric.

* * * * *